(12) United States Patent
Oh et al.

(10) Patent No.: US 9,570,710 B2
(45) Date of Patent: Feb. 14, 2017

(54) ORGANIC LIGHT-EMITTING DISPLAY APPARATUS AND METHOD OF MANUFACTURING THE SAME INCLUDING RGB INSULATING LAYER CONFIGURATION

(71) Applicant: SAMSUNG DISPLAY CO., LTD., Yongin, Gyeonggi-Do (KR)

(72) Inventors: Jaehwan Oh, Yongin (KR); Jaebeom Choi, Yongin (KR); Sehun Park, Yongin (KR); Yongduck Son, Yongin (KR); Jiyoun Lee, Yongin (KR); Youngjin Chang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 94 days.

(21) Appl. No.: 14/698,089

(22) Filed: Apr. 28, 2015

(65) Prior Publication Data
US 2016/0079315 A1   Mar. 17, 2016

(30) Foreign Application Priority Data

Sep. 15, 2014  (KR) .......................... 10-2014-0122042

(51) Int. Cl.
*H01L 29/08*   (2006.01)
*H01L 51/52*   (2006.01)
*H01L 27/32*   (2006.01)

(52) U.S. Cl.
CPC ....... *H01L 51/5271* (2013.01); *H01L 27/3211* (2013.01)

(58) Field of Classification Search
CPC .. H01L 51/5271; H01L 51/56; H01L 27/3211; H01L 27/3216; H01L 27/3218; H01L 27/3248; H01L 27/3258; H01L 2227/323
USPC .......................................................... 257/40
See application file for complete search history.

(56) References Cited

U.S. PATENT DOCUMENTS

2006/0017377 A1   1/2006   Ryu
2011/0229994 A1   9/2011   Jung

FOREIGN PATENT DOCUMENTS

| JP | 2006-269326 A | 10/2006 |
| JP | 2012-248517 A | 12/2012 |
| JP | 2014-022091 A | 2/2014 |
| KR | 10-2006-0007899 A | 1/2006 |
| KR | 10-2011-0109049 A | 10/2011 |

*Primary Examiner* — Matthew Gordon
(74) *Attorney, Agent, or Firm* — Lee & Morse, P.C.

(57) ABSTRACT

An organic light-emitting display apparatus, including a substrate; a first reflective layer, a second reflective layer, and a third reflective layer that are separately disposed on the substrate; a first insulating layer on the first reflective layer, but not on the second reflective layer and the third reflective layer; a second insulating layer on the first insulating layer and the second reflective layer, but not on the third reflective layer; and a first pixel electrode for red emission on the second insulating layer and corresponding to the first reflective layer, a second pixel electrode for green emission on the second insulating layer and corresponding to the second reflective layer, and a third pixel electrode for blue emission on the third reflective layer.

17 Claims, 6 Drawing Sheets

ORGANIC LIGHT-EMITTING DISPLAY APPARATUS AND METHOD OF MANUFACTURING THE SAME INCLUDING RGB INSULATING LAYER CONFIGURATION

CROSS-REFERENCE TO RELATED APPLICATION

Korean Patent Application No. 10-2014-0122042, filed on Sep. 15, 2014, in the Korean Intellectual Property Office, and entitled: "Organic Light-Emitting Display Apparatus and Method of Manufacturing the Same," is incorporated by reference herein in its entirety.

BACKGROUND

1. Field

One or more exemplary embodiments relate to a display apparatus, for example, to an organic light-emitting display apparatus and a method of manufacturing the same.

2. Description of the Related Art

Among display apparatuses, an organic light-emitting display apparatus may have a wide viewing angle, an excellent contrast ratio, and a high response speed, and may be regarded as a next-generation display apparatus.

SUMMARY

Embodiments may be realized by providing an organic light-emitting display apparatus, including a substrate; a first reflective layer, a second reflective layer, and a third reflective layer that are separately disposed on the substrate; a first insulating layer on the first reflective layer, but not on the second reflective layer and the third reflective layer; a second insulating layer on the first insulating layer and the second reflective layer, but not on the third reflective layer; and a first pixel electrode for red emission on the second insulating layer and corresponding to the first reflective layer, a second pixel electrode for green emission on the second insulating layer and corresponding to the second reflective layer, and a third pixel electrode for blue emission on the third reflective layer.

The first pixel electrode, the second pixel electrode, and the third pixel electrode may be transparent electrodes.

The first insulating layer and the second insulating layer may be transparent insulating layers.

Each of the first reflective layer, the second reflective layer, and the third reflective layer may include a metal material.

The organic light-emitting display apparatus may further include a thin-film transistor electrically connected to each of the substrate, the first pixel electrode, the second pixel electrode, and the third pixel electrode. The thin-film transistor may include a semiconductor layer, a gate electrode, and source and drain electrodes, and each of the first reflective layer, the second reflective layer, and the third reflective layer may include a same material as one or more of the gate electrode or the source and drain electrodes of the thin-film transistor.

The first insulating layer may not be between the second pixel electrode and the second reflective layer and may not be between the third pixel electrode and the third reflective layer.

The second insulating layer may not be between the third pixel electrode and the third reflective layer.

The organic light-emitting display apparatus may further include a common layer on the first pixel electrode, the second pixel electrode, and the third pixel electrode, a red emission layer on the common layer and corresponding to the first pixel electrode, a green emission layer on the common layer and corresponding to the second pixel electrode, and a blue emission layer on the common layer and corresponding to the third pixel electrode.

The organic light-emitting display apparatus may further include an opposite electrode on the red emission layer, the green emission layer, and the blue emission layer and corresponding to the first pixel electrode, the second pixel electrode, and the third pixel electrode. A first distance between a surface of the first reflective layer facing the opposite electrode and a surface of the opposite electrode that corresponds to the first pixel electrode and faces the first pixel electrode may conform to an $n^{th}$ resonance distance of light emitted from the red emission layer, a second distance between a surface of the second reflective layer facing the opposite electrode and a surface of the opposite electrode that corresponds to the second pixel electrode and faces the second pixel electrode may conform to an $n^{th}$ resonance distance of light emitted from the green emission layer, and a third distance between a surface of the third reflective layer facing the opposite electrode and a surface of the opposite electrode that corresponds to the third pixel electrode and faces the third pixel electrode may conform to an $n^{th}$ resonance distance of light emitted from the blue emission layer, where n is a natural number.

The organic light-emitting display apparatus may further include a third insulating layer on the second insulating layer and between the third pixel electrode and the third reflective layer.

Embodiments may be realized by providing a method of manufacturing an organic light-emitting display apparatus, the method including preparing a substrate, and forming a first reflective layer, a second reflective layer, and a third reflective layer on the substrate such that the first reflective layer, the second reflective layer, and the third reflective layer are separate from each other; forming a first insulating layer on the first reflective layer, but not on the second reflective layer and the third reflective layer; forming a second insulating layer on the first insulating layer and the second reflective layer, but not on the third reflective layer; and forming a first pixel electrode for red emission, a second pixel electrode for green emission, and a third pixel electrode for blue emission that correspond to the first reflective layer, the second reflective layer, and the third reflective layer, respectively, that are separately formed on the substrate.

The first pixel electrode, the second pixel electrode, and the third pixel electrode may be formed as transparent electrodes.

The method may further include forming a third insulating layer on the second insulating layer and between the third pixel electrode and the third reflective layer.

The first insulating layer, the second insulating layer, and the third insulating layer may be formed as transparent insulating layers.

Each of the first reflective layer, the second reflective layer, and the third reflective layer may be formed of a metal material.

The method may further include forming a thin-film transistor electrically connected to each of the first pixel electrode, the second pixel electrode, and the third pixel electrode. Forming the thin-film transistor may include forming a semiconductor layer, a gate electrode, and source and drain electrodes, and forming the first reflective layer, the second reflective layer, and the third reflective layer may simultaneously be performed with one of forming the gate electrode or forming the source and drain electrodes.

The method may further include forming a common layer on the first pixel electrode, the second pixel electrode, and the third pixel electrode; and forming a red emission layer, a green emission layer, and a blue emission layer on the common layer. The red emission layer, the green emission layer, and the blue emission layer may correspond to the first pixel electrode, the second pixel electrode, and the third pixel electrode, respectively.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Those components that are the same or are in correspondence are rendered the same reference numeral regardless of the figure number, and redundant explanations are omitted.

Throughout the specification, while such terms as "first," "second," etc., may be used to describe various components, such components must not be limited to the above terms. The above terms are used only to distinguish one component from another. Also, a singular form may include plural forms, unless there is a particular description contrary thereto.

Throughout the specification, terms such as "comprise" or "comprising" are used to specify existence of features and/or components described in the specification, not excluding the existence of one or more other features and/or one or more other components. Also, it will be understood that when a layer, an area, a component, or the like is referred to as being "on" another layer, area, or component can be directly on another layer, area, or component or intervening layer, area, or component may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawings, the dimensions or thicknesses of layers and regions may be exaggerated for clarity. For example, the thicknesses and sizes of elements in the drawings are arbitrarily shown for convenience of description.

Hereinafter, in one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

In one or more embodiments, an order of processes may be different from that is described. For example, two processes that are sequentially described may be substantially simultaneously performed, or may be performed in an opposite order to the described order.

As used herein, the term "and/or" includes any and all combinations of one or more of the associated listed items. Expressions such as "at least one of," when preceding a list of elements, modify the entire list of elements and do not modify the individual elements of the list.

Figure 1:
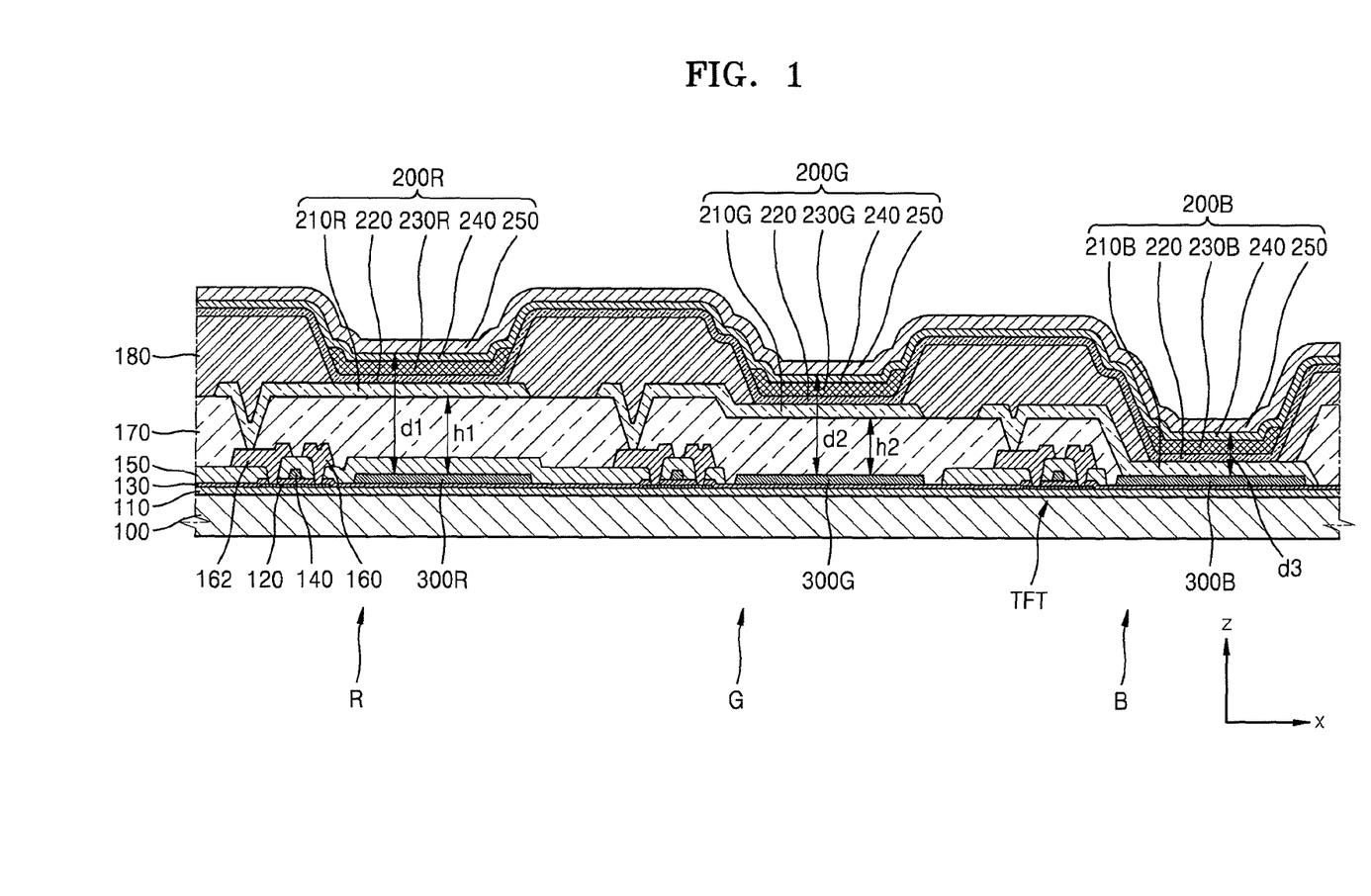
FIG. 1 illustrates a cross-sectional view of an organic light-emitting display apparatus according to an embodiment.

FIG. 1 illustrates a cross-sectional view of an organic light-emitting display apparatus according to an embodiment. Referring to FIG. 1, the organic light-emitting display apparatus may include a substrate 100, a first reflective layer 300R, a second reflective layer 300G, and a third reflective layer 300B that are separately disposed on the substrate 100, a first insulating layer 150 disposed on the first reflective layer 300R, a second insulating layer 170 disposed on the first reflective layer 300R and the second reflective layer 300G, and a first pixel electrode 210R, a second pixel electrode 210G, and a third pixel electrode 210B (also, referred to as 'pixel electrodes 210R, 210G, and 210B') that correspond to the first reflective layer 300R, the second reflective layer 300G, and the third reflective layer 300B, respectively.

The substrate 100 may be formed of various materials such as a glass material, a metal material, or a plastic material such as polyethylene terephthalate, polyethylene naphthalate, or polyimide. The first reflective layer 300R, the second reflective layer 300G, and the third reflective layer 300B may be separately disposed on the substrate 100, and an insulating layer such as a buffer layer 110 or a gate insulating layer 130 may be interposed between the substrate and the first reflective layer 300R, the second reflective layer 300G, and the third reflective layer 300B. The first reflective layer 300R, the second reflective layer 300G, and the third reflective layer 300B may be disposed below the first pixel electrode 210R, the second pixel electrode 210G, and the third pixel electrode 210B, respectively, so as to correspond to the first pixel electrode 210R, the second pixel electrode 210G, and the third pixel electrode 210B, respectively, and may reflect light in an opposite direction of the substrate 100.

The first pixel electrode 210R for red emission corresponding to the first reflective layer 300R, the second pixel electrode 210G for green emission corresponding to the second reflective layer 300G, and the third pixel electrode 210B for blue emission corresponding to the third reflective layer 300B may be disposed on the first reflective layer 300R, the second reflective layer 300G, and the third reflective layer 300B, respectively. Thin-film transistors TFT that may be electrically connected to the first pixel electrode 210R, the second pixel electrode 210G, and the third pixel electrode 210B may be disposed respectively between the first reflective layer 300R and the first pixel electrode 210R, the second reflective layer 300G and the second pixel electrode 210G, and the third reflective layer 300B and the third pixel electrode 210B. Although not illustrated in FIG. 1, a capacitor, for example, may be interposed therebetween.

Hereinafter, a general structure of the thin-film transistor TFT is described in detail. The thin-film transistor TFT may include a semiconductor layer 120, a gate electrode 140, a source electrode 160, and a drain electrode 162 that may include amorphous silicon, polycrystalline silicon or an organic semiconductor material. The buffer layer 110 that may be formed of silicon oxide or silicon nitride may be disposed on the substrate 100, the semiconductor layer 120 may be disposed on the buffer layer 110, and a top surface of the substrate 100 may be planarized or penetration of foreign substances into the semiconductor layer 120 may be prevented.

The gate electrode 140 may be disposed on the semiconductor layer 120, and, in response to a signal applied to the gate electrode 140, the source electrode 160 and the drain electrode 162 may be electrically connected. In consideration of, for example, adhesion with an adjacent layer, surface planarization of a stacked layer, or formability, the gate electrode 140 may be formed as a single layer or a multistack layer including one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu). The gate insulating layer 130 that may be formed of silicon oxide and/or silicon nitride may be interposed between the semiconductor layer 120 and the gate electrode 140, and insulation between the semiconductor layer 120 and the gate electrode 140 may be assured.

The buffer layer 110 and the gate insulating layer 130 may be disposed on an overall surface of the substrate 100.

The first insulating layer 150 may be disposed on the gate electrode 140 and may function as an interlayer insulating layer that may insulate the gate electrode 140 from the source electrode 160 and the drain electrode 162 to be described below. The first insulating layer 150 may be formed of a transparent or translucent material, e.g., a silicon oxide layer, a silicon nitride layer, or a silicon oxynitride layer.

The source electrode 160 and the drain electrode 162 may be formed on the first insulating layer 150. The source electrode 160 and the drain electrode 162 may be electrically connected to the semiconductor layer 120 via contact holes that may be formed in the first insulating layer 150 and the gate insulating layer 130. In consideration of conductivity, the source electrode 160 and the drain electrode 162 may be formed as a single layer or a multistack layer including one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

A protective layer (not shown) may be disposed on the thin-film transistor TFT, and may cover the thin-film transistor TFT. The protective layer may be formed of an inorganic material such as silicon oxide, silicon nitride, or silicon oxynitride.

The second insulating layer 170 may be disposed on the protective layer. The second insulating layer 170 may function as a planarization layer or a protective layer. For example, as illustrated in FIG. 1, a red sub-pixel 200R, a green sub-pixel 200G, and a blue sub-pixel 200B (also, referred to as 'sub-pixels 200R, 200G, and 200B') may be disposed on the thin-film transistor TFT, and the second insulating layer 170 may be disposed as the planarization layer for generally planarizing a surface of the thin-film transistor TFT. The second insulating layer 170 may be formed of an acryl-based organic material or benzocyclobutene (BCB). Referring to FIG. 1, the second insulating layer 170 may be formed as a single layer. In an embodiment, the second insulating layer 170 may have various forms including a multistack layer. The second insulating layer 170 may be formed of a transparent or translucent material, e.g., a silicon oxide layer, a silicon nitride layer, or a silicon oxynitride layer.

Referring to FIG. 1, as described above, the first reflective layer 300R, the second reflective layer 300G, and the third reflective layer 300B may be separately disposed on the gate insulating layer 130. In an embodiment, the first reflective layer 300R, the second reflective layer 300G, and the third reflective layer 300B may be disposed on a same layer as the gate electrode 140 of the thin-film transistor TFT. The first reflective layer 300R, the second reflective layer 300G, and the third reflective layer 300B may include a metal material, i.e., a same metal material as the gate electrode 140, and each of the first reflective layer 300R, the second reflective layer 300G, and the third reflective layer 300B may be formed as a single layer or a multistack layer including one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

An opening for exposing at least one of the source electrode 160 and the drain electrode 162 of the thin-film transistor TFT may be formed on the second insulating layer 170, and the first pixel electrode 210R, the second pixel electrode 210G, the third pixel electrode 210B that may be electrically connected to the thin-film transistor TFT by contacting one of the source electrode 160 and the drain electrode 162 via the opening may be disposed on the second insulating layer 170 while the first pixel electrode 210R, the second pixel electrode 210G, and the third pixel electrode 210B are separate from each other.

The first pixel electrode 210R, the second pixel electrode 210G, and the third pixel electrode 210B may be formed as transparent or translucent electrodes. When the first pixel electrode 210R, the second pixel electrode 210G, and the third pixel electrode 210B are formed as transparent or translucent electrodes, the first pixel electrode 210R, the second pixel electrode 210G, and the third pixel electrode 210B may be formed of ITO, IZO, ZnO, $In_2O_3$, IGO or AZO. In an embodiment, the first pixel electrode 210R, the second pixel electrode 210G, and the third pixel electrode 210B may be formed of various materials and may have one of various structures including, for example, a single-layer structure or a multilayer structure.

A pixel-defining layer 180 may be disposed on the second insulating layer 170. The pixel-defining layer 180 may define pixels by having openings that respectively correspond to sub-pixels, i.e., the pixel-defining layer 180 has openings that cover sides of the pixel electrodes 210R, 210G, and 210B and expose center portions of the pixel electrodes 210R, 210G, and 210B, respectively. As illustrated in FIG. 1, the pixel-defining layer 180 may increase a distance between ends of the pixel electrodes 210R, 210G, and 210B and an opposite electrode 250 that may be disposed above each of the pixel electrodes 210R, 210G, and 210B, and may prevent an arc occurring at the ends of the pixel electrodes 210R, 210G, and 210B. The pixel-defining layer 180 may be formed of an organic material such as polyimide.

As illustrated in FIG. 1, the red sub-pixel 200R, the green sub-pixel 200G, and the blue sub-pixel 200B that may include the first pixel electrode 210R, the second pixel electrode 210G, and the third pixel electrode 210B, respectively, may be disposed on the second insulating layer 170. Each of the sub-pixels 200R, 200G, and 200B may include an emission layer (EML). For example, the red sub-pixel 200R may include the first pixel electrode 210R and a red emission layer 230R that may be disposed on the first pixel electrode 210R so as to correspond to the first pixel electrode 210R, the green sub-pixel 200G may include the second pixel electrode 210G and a green emission layer 230G that may be disposed on the second pixel electrode 210G so as to correspond to the second pixel electrode 210G, and the blue sub-pixel 200B may include the third pixel electrode 210B and a blue emission layer 230B that may be disposed on the third pixel electrode 210B so as to correspond to the third pixel electrode 210B. The red emission layer 230R, the green emission layer 230G, and the blue emission layer 230B (also referred to as 'emission layers 230R, 230G, and 230B') may have wavelength ranges that are different from each other, and in a case of front emission by which light may be reflected from the first reflective layer 300R through the third reflective layer 300B and may travel in the opposite direction of the substrate 100, different resonance distances may be applied thereto.

A first common layer 220 may be interposed between the pixel electrodes 210R, 210G, and 210B and the red emission layer 230R, the green emission layer 230G, and the blue emission layer 230B. The first common layer 220 may not be partitioned according to the pixel electrodes 210R, 210G, and 210B, and may be disposed on an overall surface of the substrate 100. The first common layer 220 may have a structure in which, for example, a hole injection layer (HIL) or a hole transport layer (HTL), are singularly or multiply stacked. A second common layer 240 may be interposed between the opposite electrode 250 and each of the red emission layer 230R, the green emission layer 230G, and the blue emission layer 230B. The second common layer 240 may not be partitioned according to the sub-pixels 200R, 200G, and 200B, and may be disposed on an overall surface of the substrate 100. The second common layer 240 may have a structure in which, for example, an electron transport layer (ETL) or an electron injection layer (EIL), are singularly or multiply stacked. Referring to FIG. 1, for example, the first common layer 220 may be disposed below the emission layers 230R, 230G, and 230B, and the second common layer 240 may be disposed on the emission layers 230R, 230G, and 230B. In an embodiment, only the first common layer 220 or the second common layer 240 may be disposed.

The red emission layer 230R through the blue emission layer 230B, the first common layer 220, and the second common layer 240 may include a small molecule material or a polymer material. The small molecule material may include various organic materials including, for example, copper phthalocyanine (CuPc), N,N'-Di(naphthalene-1-yl)-N,N'-diphenyl-benzidine (NPB), or tris-8-hydroxyquinoline aluminum)(Alq3). The layers may be formed using, for example, a vapor deposition method.

The red emission layer 230R through the blue emission layer 230B, the first common layer 220, and the second common layer 240 may include the polymer material, and they may include a HTL as the first common layer 220. For example, the polymer HTL may be formed of poly(3,4-ethylenedioxythiophene) (PEDOT), and the red emission layer 230R through the blue emission layer 230B may be formed of, for example, a poly-phenylenevinylene (PPV)-based polymer material or a polyfluorene-based polymer material, using a screen printing method, an inkjet printing method, or a laser induced thermal imaging (LITI) method.

The opposite electrode 250 may be disposed on the red emission layer 230R through the blue emission layer 230B and may be disposed on an overall surface of the substrate 100. In an embodiment, the opposite electrode 250 may be integrally formed with the sub-pixels 200R, 200G, and 200B.

The opposite electrode 250 may be formed as a transparent or translucent electrode. For example, when the opposite electrode 250 is formed as transparent or translucent electrode, the opposite electrode 250 may have a layer formed of Li, Ca, LiF/Ca, LiF/Al, Al, Ag, Mg, or a compound thereof having a small work function and a transparent or translucent conductive layer including ITO, IZO, ZnO or $In_2O_3$.

Referring to FIG. 1, as described above, the first reflective layer 300R, the second reflective layer 300G, and the third reflective layer 300B may be separately disposed on the gate insulating layer 130. In an embodiment, the first reflective layer 300R, the second reflective layer 300G, and the third reflective layer 300B may be disposed on a same layer as the gate electrode 140 and may include a same material as the gate electrode 140. In an embodiment, the first reflective layer 300R, the second reflective layer 300G, and the third reflective layer 300B may include a same material as the source electrode 160 and the drain electrode 162.

The first insulating layer 150 may be disposed on the first reflective layer 300R, and the second insulating layer 170 may be further disposed on the first insulating layer 150 that may be disposed on the first reflective layer 300R. The first pixel electrode 210R for red emission may be disposed on the second insulating layer 170 so as to correspond to the first reflective layer 300R.

The second insulating layer 170 may be disposed on the second reflective layer 300G. Unlike the first reflective layer 300R, the first insulating layer 150 may not be on the second reflective layer 300G, and compared to a distance h1 between a top surface of the first reflective layer 300R and a top surface of the insulating layer 170 that may be disposed on the first reflective layer 300R, a distance h2 between a top surface of the second reflective layer 300G and a top surface of the second insulating layer 170 that may be disposed on the second reflective layer 300G may be decreased by an amount equal to a thickness of the first insulating layer 150. The first insulating layer 150 and the second insulating layer 170 may not be disposed on the third reflective layer 300B. Thus, the third pixel electrode 210B for blue emission may be directly disposed on the third reflective layer 300B so as to correspond to the third reflective layer 300B.

As described above, the first insulating layer 150 may be interposed between the first pixel electrode 210R and the first reflective layer 300R, may not be interposed between the second pixel electrode 210G and the second reflective layer 300G, and may not be interposed between the third pixel electrode 210B and the third reflective layer 300B. The second insulating layer 170 may be interposed between the first pixel electrode 210R and the first reflective layer 300R and between the second pixel electrode 210G and the second reflective layer 300G, and may not be interposed between the third pixel electrode 210B and the third reflective layer 300B.

As described above, the red emission layer 230R, the green emission layer 230G, and the blue emission layer 230B may have different wavelength ranges, and the red sub-pixel 200R, the green sub-pixel 200G, and the blue sub-pixel 200B may have different resonance distances.

A distance d1 between a surface of the first reflective layer 300R that faces the opposite electrode 250 and a surface of the opposite electrode 250 that corresponds to the first pixel electrode 21 OR and faces the first pixel electrode 21 OR may conform to an $n^{th}$ resonance distance of light that is emitted from the red emission layer 230R (where n may be a natural number). The resonance distance d1 of the red sub-pixel 200R may be between about 1000 Å and about 9000 Å.

A distance d2 between a surface of the second reflective layer 300G that faces the opposite electrode 250 and a surface of the opposite electrode 250 that corresponds to the second pixel electrode 210G and faces the second pixel electrode 210G may conform to an $n^{th}$ resonance distance of light that is emitted from the green emission layer 230G (where n may be a natural number). The resonance distance d2 of the green sub-pixel 200G may be between about 800 Å and about 8800 Å.

A distance d3 between a surface of the third reflective layer 300B that faces the opposite electrode 250 and a surface of the opposite electrode 250 that corresponds to the third pixel electrode 210B and faces the third pixel electrode 210B may correspond to an $n^{th}$ resonance distance of light that is emitted from the blue emission layer 230B (where n may be a natural number). The resonance distance d3 of the blue sub-pixel 200B may be between about 600 Å and about 8600 Å.

As described above, the red emission layer 230R, the green emission layer 230G, and the blue emission layer 230B may have different wavelength ranges, and the red sub-pixel 200R, the green sub-pixel 200G, and the blue sub-pixel 200B may be formed to have different resonance distances. For the red sub-pixel 200R and the green sub-pixel 200G that may have relatively long resonance distances, compared to that of the blue sub-pixel 200B, a red auxiliary layer may be further disposed between the first pixel electrode 210R and the red emission layer 230R, and a resonance distance may be complemented, and a green auxiliary layer may be further disposed between the second pixel electrode 210G and the green emission layer 230G. In an embodiment, this further disposition may require at least two masks for forming the red auxiliary layer and the green auxiliary layer so as to provide different thicknesses for the red auxiliary layer and the green auxiliary layer for the red sub-pixel 200R and the green sub-pixel 200G, respectively.

As described above, the organic light-emitting display apparatus according to the present embodiment may have a structure in which the first pixel electrode 21 OR through the third pixel electrode 210B are formed as transparent or translucent electrodes, and the first reflective layer 300R through the third reflective layer 300B that include a same metal material as the gate electrode 140 or the source and drain electrodes 160 and 162 of the thin-film transistor TFT are disposed to correspond to the first pixel electrode 210R through the third pixel electrode 210B, respectively. The first insulating layer 150 and the second insulating layer 170 may be interposed between the first pixel electrode 21 OR and the first reflective layer 300R, the first insulating layer 150 may not be interposed between the second pixel electrode 210G and the second reflective layer 300G, and the first insulating layer 150 and the second insulating layer 170 may not be disposed between the third pixel electrode 210B and the third reflective layer 300B, and an appropriate resonance distance may be arranged for each of the sub-pixels without a separate auxiliary layer.

As described above, when a device unit such as the thin-film transistor TFT or the capacitor is formed, resonance distances may be matched with each other according to the sub-pixels using a structure of an insulating layer formed below the first pixel electrode 210R through the third pixel electrode 210B, and a process for the organic light-emitting display apparatus may be simplified without addition of a mask.

Figure 2:
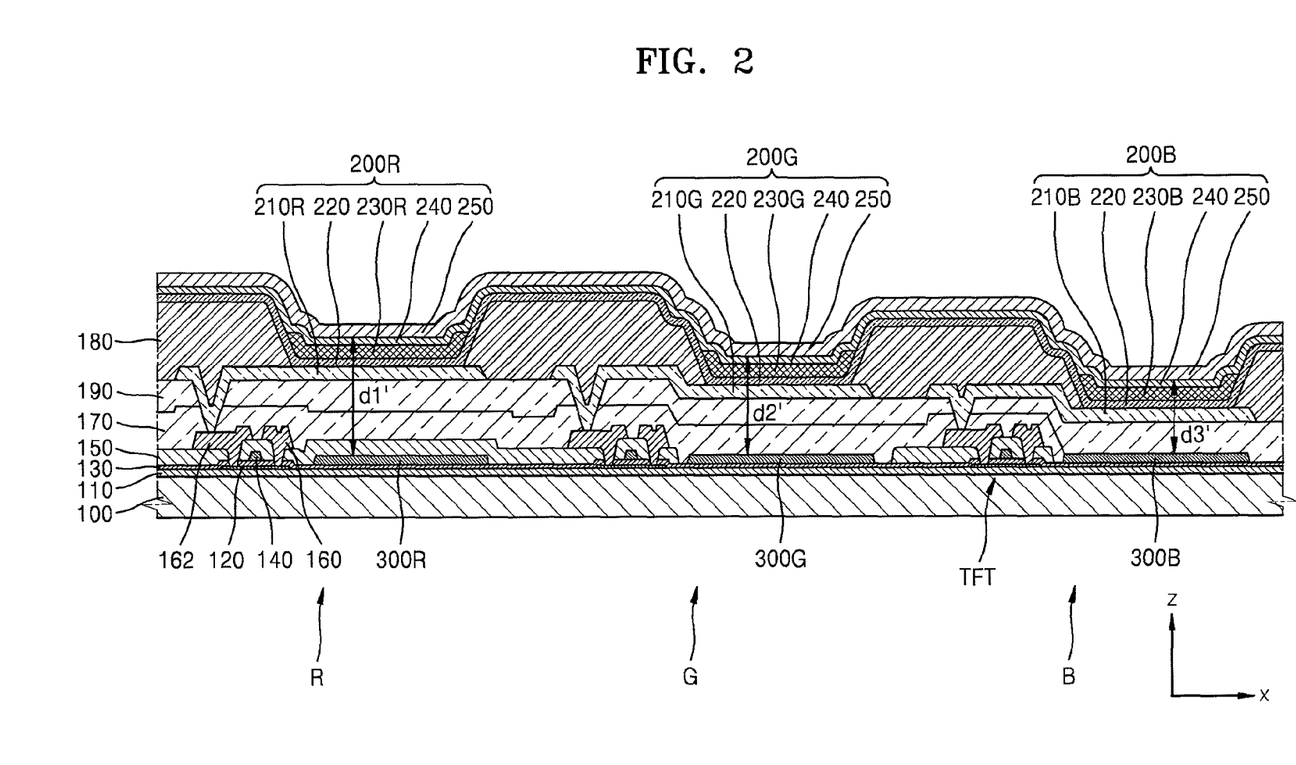
FIG. 2 illustrates a cross-sectional view of an organic light-emitting display apparatus according to an embodiment.

FIG. 2 illustrates a cross-sectional view of an organic light-emitting display apparatus according to an embodiment. Referring to FIG. 2, the organic light-emitting display apparatus may include the substrate 100, the first reflective layer 300R, the second reflective layer 300G, and the third reflective layer 300B that are separately disposed on the substrate 100, the first insulating layer 150 disposed on the first reflective layer 300R, the second insulating layer 170 disposed on the first reflective layer 300R and the second reflective layer 300G, a third insulating layer 190 disposed on the second insulating layer 170 and the third reflective layer 300B, and a first pixel electrode 210R, a second pixel electrode 210G, and a third pixel electrode 210B that correspond to the first reflective layer 300R, the second reflective layer 300G, and the third reflective layer 300B, respectively. In the embodiment of FIG. 2, a structure of a thin-film transistor TFT or descriptions about sub-pixels 200R, 200G, and 200B are the same as those of the embodiment of FIG. 1, and detailed descriptions, which are the same as the aforementioned contents, will be omitted.

Referring to FIG. 2, the third insulating layer 190 may be further disposed on the second insulating layer 170. The third insulating layer 190 may be formed of a transparent organic material, e.g., a photoimide-based material, a photoacryl-based material, or a siloxane-based material.

The first insulating layer 150, the second insulating layer 170, and the third insulating layer 190 may be disposed on the first reflective layer 300R, the second insulating layer 170 and the third insulating layer 190 may be disposed on the second reflective layer 300G, and the third insulating layer 190 may be disposed on the third reflective layer 300B. In the embodiment of FIG. 2, the third insulating layer 190 may be further disposed on the second insulating layer 170, and resonance distances d1', d2', and d3' may be further exactly adjusted according to the sub-pixels 200R, 200G, and 200B.

Although the organic light-emitting display apparatus has been mainly described, also provided is a method of manufacturing the organic light-emitting display apparatus.

Figure 3:
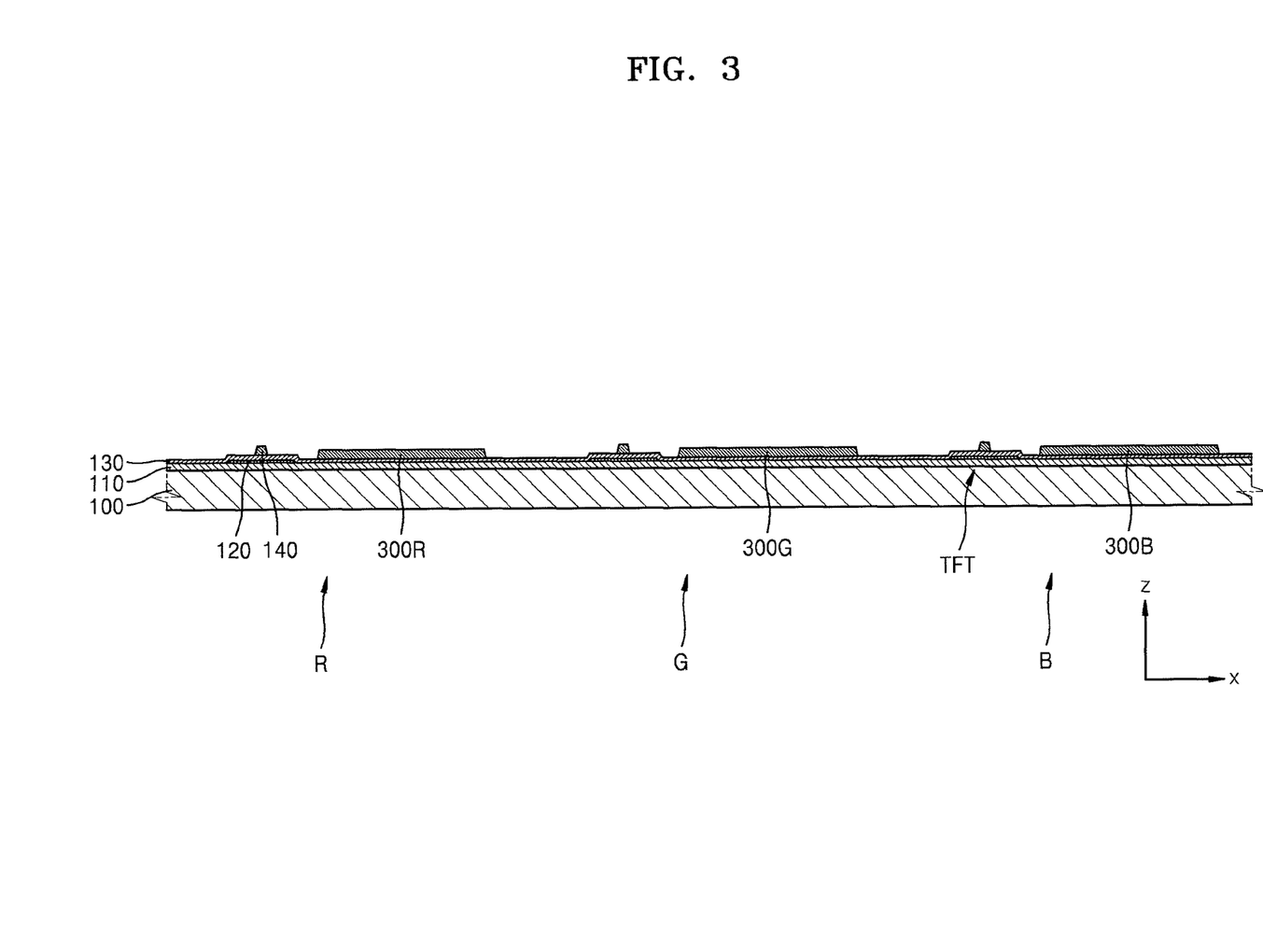
FIGS. 3 through 6 illustrate cross-sectional views of a manufacturing procedure of the organic light-emitting display apparatus of FIG. 1.

FIGS. 3 through 6 illustrate cross-sectional views of a manufacturing procedure of the organic light-emitting display apparatus of FIG. 1. Referring to FIG. 3, first, the substrate 100 that may be formed of various materials such as a glass material, a metal material, or a plastic material such as polyethylene terephthalate, polyethylene naphthalate, or polyimide is arranged. The buffer layer 110 that may be formed of silicon oxide or silicon nitride may be disposed on the substrate 100, and a top surface of the substrate 100 may be planarized or penetration of foreign substances into the semiconductor layer 120 may be prevented. The semiconductor layer 120 may be patterned on the buffer layer 110.

The gate insulating layer 130 that may be formed of silicon oxide and/or silicon nitride may be formed on the semiconductor layer 120, the semiconductor layer 120 may be covered, and the gate insulating layer 130 may function to assure an insulation between the semiconductor layer 120 and the gate electrode 140. The buffer layer 110 and the gate insulating layer 130 may be disposed on an overall surface of the substrate 100.

The gate electrode 140 may be formed on the semiconductor layer 120, and in response to a signal applied to the gate electrode 140, the source electrode 160 and the drain electrode 162 may be electrically connected. In consideration of, for example, adhesion with an adjacent layer, surface planarization of a stacked layer, or formability, the gate electrode 140 may be formed as a single layer or a multistack layer including one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

When the gate electrode 140 is formed, the first reflective layer 300R, the second reflective layer 300G, and the third reflective layer 300B may also be formed to be separate from each other on the substrate 100, and the first reflective layer 300R, the second reflective layer 300G, and the third reflective layer 300B may be formed by including a same metal material as the gate electrode 140. Referring to FIG. 1, the first reflective layer 300R, the second reflective layer 300G, the third reflective layer 300B, and the gate electrode 140 may be simultaneously formed. In an embodiment, the first reflective layer 300R, the second reflective layer 300G, and the third reflective layer 300B may be formed by including a metal material, and the first reflective layer 300R, the second reflective layer 300G, and the third reflective layer 300B may be simultaneously formed with the source electrode 160 and the drain electrode 162. The first reflective layer 300R, the second reflective layer 300G, and the third reflective layer 300B may be disposed below the first pixel electrode 210R, the second pixel electrode 210G, and the third pixel electrode 210B, respectively, and may function to reflect light in an opposite direction of the substrate 100.

Figure 4:
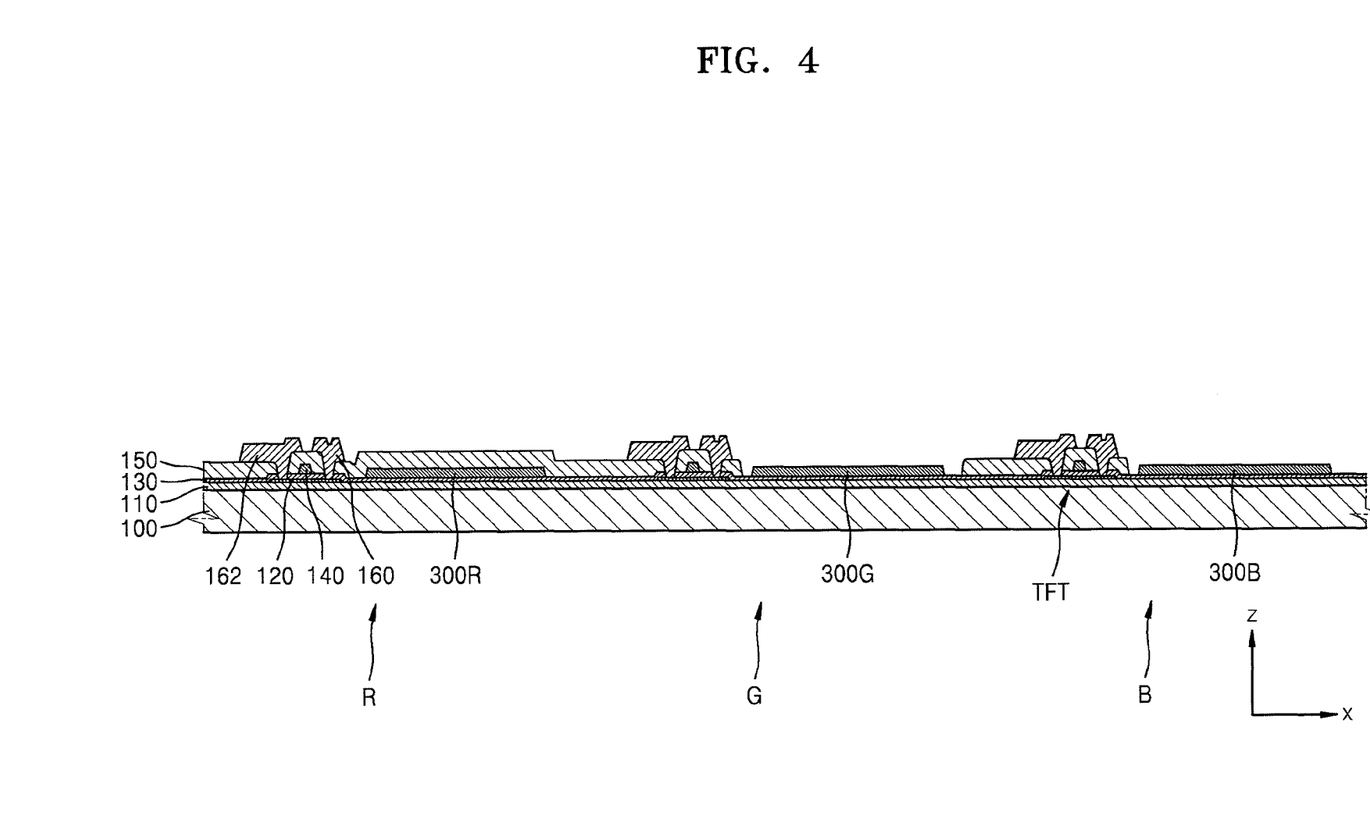

Afterward, referring to FIG. 4, the first insulating layer 150 may be formed on the gate electrode 140 and the first reflective layer 300R. The first insulating layer 150 may not be formed on the second reflective layer 300G and the third reflective layer 300B. The first insulating layer 150 that may be formed on the gate electrode 140 may function as an interlayer insulating layer that may insulate the gate electrode 140 from the source electrode 160 and the drain electrode 162. The first insulating layer 150 may be formed of a transparent or translucent material, e.g., a silicon oxide layer, a silicon nitride layer, or a silicon oxynitride layer.

The source electrode 160 and the drain electrode 162 may be formed on the first insulating layer 150. The source electrode 160 and the drain electrode 162 may be electrically connected to the semiconductor layer 120 via contact holes that may be formed in the first insulating layer 150 and the gate insulating layer 130. In consideration of conductivity, the source electrode 160 and the drain electrode 162 may be formed as a single layer or a multistack layer including one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

In an embodiment, a protective layer (not shown) may be disposed on the thin-film transistor TFT, and may cover the thin-film transistor TFT. The protective layer may be formed of an inorganic material such as silicon oxide, silicon nitride, or silicon oxynitride.

Figure 5:
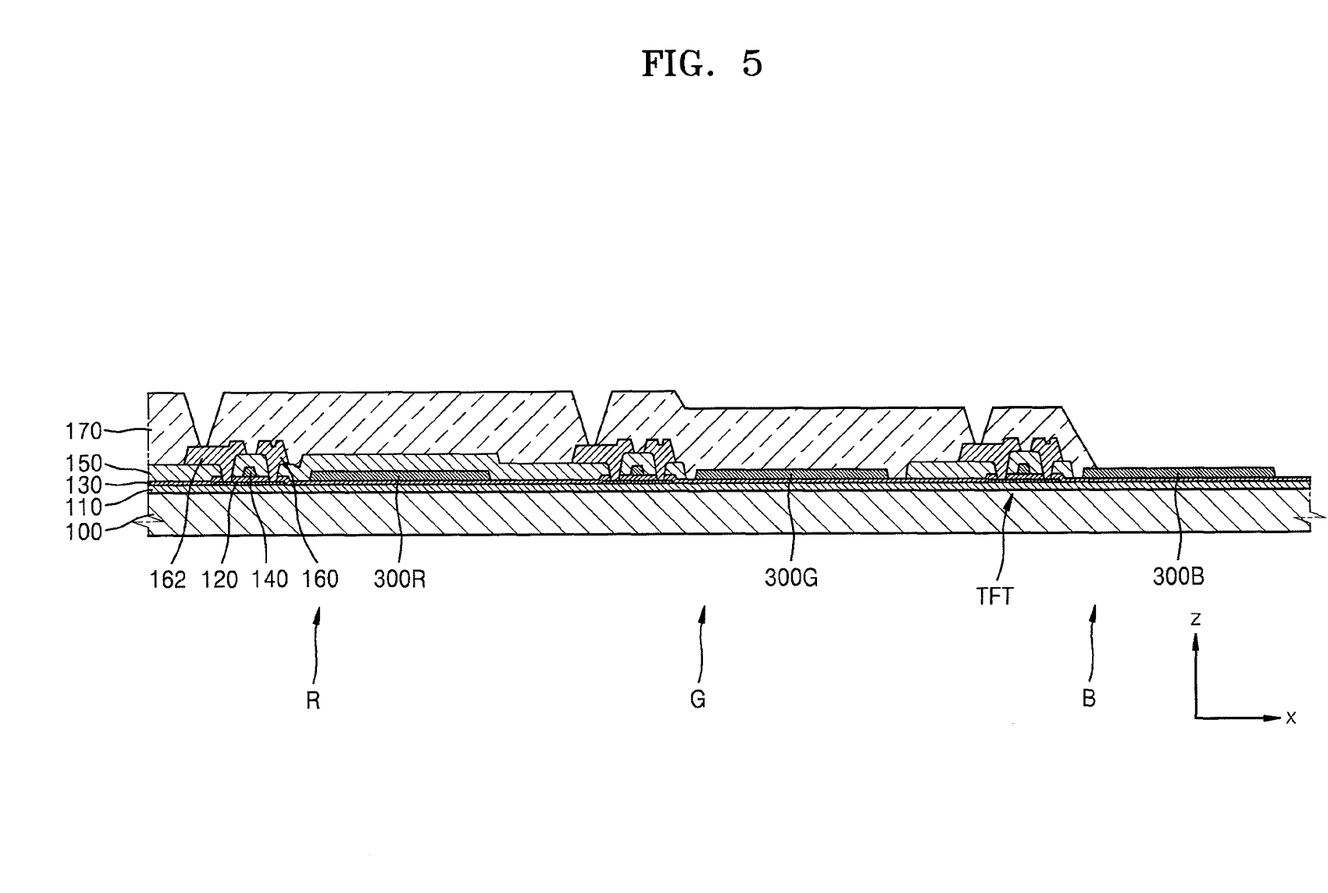

Afterward, referring to FIG. 5, the second insulating layer 170 may be disposed on the thin-film transistor TFT. As illustrated in FIG. 5, the red sub-pixel 200R, the green sub-pixel 200G, and the blue sub-pixel 200B may be disposed on the thin-film transistor TFT, and the second insulating layer 170 may be disposed as a planarization layer for generally planarizing a top surface of the thin-film transistor TFT. Referring to FIG. 5, the second insulating layer 170 may formed as a single layer. In an embodiment the second insulating layer 170 may have various forms including a multistack layer. The second insulating layer 170 may be formed of a transparent or translucent material, e.g., a silicon oxide layer, a silicon nitride layer, or a silicon oxynitride layer.

An opening for exposing at least one of the source electrode 160 and the drain electrode 162 of the thin-film transistor TFT may be formed on the second insulating layer 170, and the first pixel electrode 210R, the second pixel electrode 210G, the third pixel electrode 210B may be electrically connected to the thin-film transistor TFT by contacting one of the source electrode 160 and the drain electrode 162 via the opening.

In an embodiment, the second insulating layer 170 may be formed on the first reflective layer 300R and the second reflective layer 300G and may not be formed on the third reflective layer 300B. The first insulating layer 150 may not be formed below the second insulating layer 170 that may be disposed on the second reflective layer 300G, and a step difference equal to a thickness of the first insulating layer 150 may occur on the second insulating layer 170.

Figure 6:
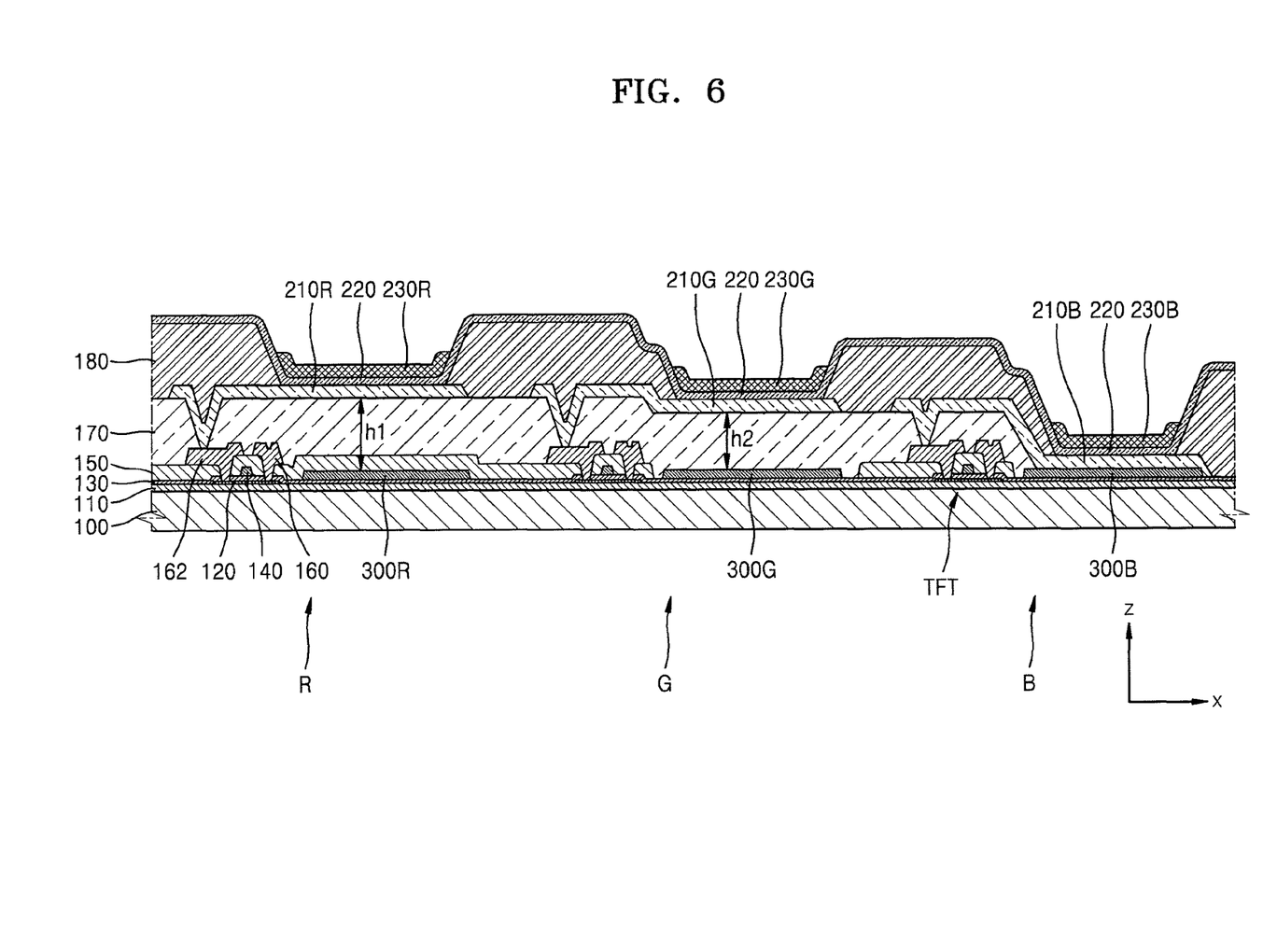

Afterward, referring to FIG. 6, the first pixel electrode 210R for red emission that corresponds to the first reflective layer 300R, the second pixel electrode 210G for green emission that corresponds to the second reflective layer 300G, and the third pixel electrode 210B for blue emission that corresponds to the third reflective layer 300B may be disposed on the first reflective layer 300R, the second reflective layer 300G, and the third reflective layer 300B, respectively. The first pixel electrode 210R, the second pixel electrode 210G, and the third pixel electrode 210B may be formed as transparent or translucent electrodes.

The pixel-defining layer 180 may be disposed on the second insulating layer 170. The pixel-defining layer 180 may define pixels by having openings that respectively correspond to sub-pixels, i.e., the pixel-defining layer 180 has openings that cover sides of the pixel electrodes 210R, 210G, and 210B and expose center portions of the pixel electrodes 210R, 210G, and 210B, respectively. The pixel-defining layer 180 may be formed of an organic material such as polyimide.

The first common layer 220 may be formed on the pixel electrodes 210R, 210G, and 210B. The first common layer 220 may not be partitioned according to the pixel electrodes 210R, 210G, and 210B, and may be disposed on an overall surface of the substrate 100. The first common layer 220 may have a structure in which, for example, an HIL or an HTL, are singularly or multiply stacked.

The red sub-pixel 200R, the green sub-pixel 200G, and the blue sub-pixel 200B that may include the first pixel electrode 210R, the second pixel electrode 210G, and the third pixel electrode 210B, respectively, may be disposed on the second insulating layer 170. Each of the sub-pixels 200R, 200G, and 200B may include an EML. For example, the red sub-pixel 200R may include the first pixel electrode 21 OR and a red emission layer 230R that may be disposed on the first pixel electrode 210R so as to correspond to the first pixel electrode 210R, the green sub-pixel 200G may include the second pixel electrode 210G and a green emission layer 230G that may be disposed on the second pixel electrode 210G so as to correspond to the second pixel electrode 210G, and the blue sub-pixel 200B may include the third pixel electrode 210B and a blue emission layer 230B that may be disposed on the third pixel electrode 210B so as to correspond to the third pixel electrode 210B. The red emission layer 230R, the green emission layer 230G, and the blue emission layer 230B may have wavelength ranges that are different from each other, and in a case of front emission by which light may be reflected from the first reflective layer 300R through the third reflective layer 300B and may travel in the opposite direction of the substrate 100, different resonance distances may be applied thereto.

The second common layer 240 may be formed on the red emission layer 230R, the green emission layer 230G, and the blue emission layer 230B. The second common layer 240 may not be partitioned according to the sub-pixels 200R, 200G, and 200B, and may be disposed on an overall surface of the substrate 100. The second common layer 240 may have a structure in which, for example, an ETL or an EIL, are singularly or multiply stacked.

The opposite electrode 250 may be disposed on the red emission layer 230R through the blue emission layer 230B and may be disposed on an overall surface of the substrate 100. In an embodiment, the opposite electrode 250 may be integrally formed with the sub-pixels 200R, 200G, and 200B and may be formed as a transparent or translucent electrode.

As described above, the first reflective layer 300R, the second reflective layer 300G, and the third reflective layer 300B may be separately disposed on the gate insulating layer 130. The first insulating layer 150 may be disposed on the first reflective layer 300R, and the second insulating layer 170 may be further disposed on the first insulating layer 150 that may be disposed on the first reflective layer 300R. The first pixel electrode 21 OR for red emission may be disposed on the second insulating layer 170 so as to correspond to the first reflective layer 300R.

The second insulating layer 170 may be disposed on the second reflective layer 300G. Unlike the first reflective layer 300R, the first insulating layer 150 may not be disposed on the second reflective layer 300G, and compared to a distance h1 between a top surface of the first reflective layer 300R and a top surface of the insulating layer 170 that may be disposed on the first reflective layer 300R, a distance h2 between a top surface of the second reflective layer 300G and a top surface of the second insulating layer 170 that may be disposed on the second reflective layer 300G may be decreased by an amount equal to a thickness of the first insulating layer 150. The first insulating layer 150 and the second insulating layer 170 may not be disposed on the third reflective layer 300B. The third pixel electrode 210B for red emission may be directly disposed on the third pixel electrode 210B so as to correspond to the third reflective layer 300B.

As described above, the red emission layer 230R, the green emission layer 230G, and the blue emission layer 230B may have different wavelength ranges, and the red sub-pixel 200R, the green sub-pixel 200G, and the blue sub-pixel 200B may have different resonance distances.

As described above, the red emission layer 230R, the green emission layer 230G, and the blue emission layer 230B may have different wavelength ranges, and the red sub-pixel 200R, the green sub-pixel 200G, and the blue sub-pixel 200B may be formed to have different resonance distances. For the red sub-pixel 200R and the green sub-pixel 200G that may have relatively long resonance distances, compared to that of the blue sub-pixel 200B, a red auxiliary layer may be further disposed between the first pixel electrode 210R and the red emission layer 230R, and a resonance distance may be complemented, and a green auxiliary layer may be further disposed between the second pixel electrode 210G and the green emission layer 230G. In an embodiment, this further disposition may require at least two masks for forming the red auxiliary layer and the green auxiliary layer so as to provide different thicknesses for the red auxiliary layer and the green auxiliary layer for the red sub-pixel 200R and the green sub-pixel 200G, respectively.

As described above, the organic light-emitting display apparatus according to the present embodiment may have a structure in which the first pixel electrode 21 OR through the third pixel electrode 210B are formed as transparent or translucent electrodes, and the first reflective layer 300R through the third reflective layer 300B that include a same metal material as the gate electrode 140 or the source and drain electrodes 160 and 162 of the thin-film transistor TFT are disposed to correspond to the first pixel electrode 210R through the third pixel electrode 210B, respectively. The first insulating layer 150 and the second insulating layer 170 may be interposed between the first pixel electrode 21 OR and the first reflective layer 300R, the first insulating layer 150 may not be interposed between the second pixel electrode 210G and the second reflective layer 300G, and the first insulating layer 150 and the second insulating layer 170 may not be disposed between the third pixel electrode 210B and the third reflective layer 300B, and an appropriate resonance distance may be arranged for each of the sub-pixels without a separate auxiliary layer.

As described above, when a device unit such as the thin-film transistor TFT or the capacitor is formed, resonance distances may be matched with each other according to the sub-pixels using a structure of an insulating layer formed below the first pixel electrode 21 OR through the third pixel electrode 210B, and a process for the organic light-emitting display apparatus may be simplified without addition of a mask.

By way of summation and review, in an organic light-emitting display apparatus, a thin-film transistor and organic light-emitting devices may be formed on a substrate, and the organic light-emitting devices may actively emit light. The organic light-emitting display apparatus may be used as a display unit of a small product such as a mobile phone or a display unit of a large product such as a television.

The organic light-emitting display apparatus may include organic light-emitting devices as sub-pixels that emit as red (R), green (G), and blue (B), respectively, and each of the organic light-emitting devices may include a pixel electrode and an opposite electrode that face each other, and an intermediate layer that may be disposed between the pixel electrode and the opposite electrode and may include an emission layer. Wavelength ranges of R, G, and B emissions that form an emission layer are different from each other, and an additional process may be required in forming the intermediate layer so as to adjust resonance distances of the sub-pixels.

As described above, according to the one or more of the above exemplary embodiments, an organic light-emitting display apparatus and method of manufacturing the same may improve emission efficiency via a mask-less structure.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a substrate;
    a first reflective layer, a second reflective layer, and a third reflective layer that are separately disposed on the substrate;
    a first insulating layer on the first reflective layer, but not on the second reflective layer and the third reflective layer;
    a second insulating layer on the first insulating layer and the second reflective layer, but not on the third reflective layer; and
    a first pixel electrode for red emission on the second insulating layer and corresponding to the first reflective layer, a second pixel electrode for green emission on the second insulating layer and corresponding to the second reflective layer, and a third pixel electrode for blue emission on the third reflective layer.

2. The organic light-emitting display apparatus as claimed in claim 1, wherein the first pixel electrode, the second pixel electrode, and the third pixel electrode are transparent electrodes.

3. The organic light-emitting display apparatus as claimed in claim 2, wherein the first insulating layer and the second insulating layer are transparent insulating layers.

4. The organic light-emitting display apparatus as claimed in claim 3, wherein each of the first reflective layer, the second reflective layer, and the third reflective layer includes a metal material.

5. The organic light-emitting display apparatus as claimed in claim 4, further comprising a thin-film transistor electrically connected to each of the substrate, the first pixel electrode, the second pixel electrode, and the third pixel electrode, wherein:
    the thin-film transistor includes a semiconductor layer, a gate electrode, and source and drain electrodes, and
    each of the first reflective layer, the second reflective layer, and the third reflective layer includes a same material as one or more of the gate electrode or the source and drain electrodes of the thin-film transistor.

6. The organic light-emitting display apparatus as claimed in claim 5, wherein the first insulating layer is not between the second pixel electrode and the second reflective layer and is not between the third pixel electrode and the third reflective layer.

7. The organic light-emitting display apparatus as claimed in claim 5, wherein the second insulating layer is not between the third pixel electrode and the third reflective layer.

8. The organic light-emitting display apparatus as claimed in claim 1, further comprising a common layer on the first pixel electrode, the second pixel electrode, and the third pixel electrode, a red emission layer on the common layer and corresponding to the first pixel electrode, a green emission layer on the common layer and corresponding to the second pixel electrode, and a blue emission layer on the common layer and corresponding to the third pixel electrode.

9. The organic light-emitting display apparatus as claimed in claim 8, further comprising an opposite electrode on the red emission layer, the green emission layer, and the blue emission layer and corresponding to the first pixel electrode, the second pixel electrode, and the third pixel electrode,
    wherein a first distance between a surface of the first reflective layer facing the opposite electrode and a surface of the opposite electrode that corresponds to the first pixel electrode and faces the first pixel electrode conforms to an $n^{th}$ resonance distance of light emitted from the red emission layer,
    a second distance between a surface of the second reflective layer facing the opposite electrode and a surface of the opposite electrode that corresponds to the second pixel electrode and faces the second pixel electrode conforms to an $n^{th}$ resonance distance of light emitted from the green emission layer, and
    a third distance between a surface of the third reflective layer facing the opposite electrode and a surface of the opposite electrode that corresponds to the third pixel electrode and faces the third pixel electrode conform to an $n^{th}$ resonance distance of light emitted from the blue emission layer,
    where n is a natural number.

10. The organic light-emitting display apparatus as claimed in claim 1, further comprising a third insulating layer on the second insulating layer and between the third pixel electrode and the third reflective layer.

11. A method of manufacturing an organic light-emitting display apparatus, the method comprising:
    preparing a substrate, and forming a first reflective layer, a second reflective layer, and a third reflective layer on the substrate such that the first reflective layer, the second reflective layer, and the third reflective layer are separate from each other;
    forming a first insulating layer on the first reflective layer, but not on the second reflective layer and the third reflective layer;
    forming a second insulating layer on the first insulating layer and the second reflective layer, but not on the third reflective layer; and
    forming a first pixel electrode for red emission, a second pixel electrode for green emission, and a third pixel electrode for blue emission that correspond to the first reflective layer, the second reflective layer, and the third reflective layer, respectively, that are separately formed on the substrate.

12. The method as claimed in claim 11, wherein the first pixel electrode, the second pixel electrode, and the third pixel electrode are formed as transparent electrodes.

13. The method as claimed in claim 11, further comprising forming a third insulating layer on the second insulating layer and between the third pixel electrode and the third reflective layer.

14. The method as claimed in claim 13, wherein the first insulating layer, the second insulating layer, and the third insulating layer are formed as transparent insulating layers.

15. The method as claimed in claim 14, wherein each of the first reflective layer, the second reflective layer, and the third reflective layer is formed of a metal material.

16. The method as claimed in claim 15, further comprising forming a thin-film transistor electrically connected to each of the first pixel electrode, the second pixel electrode, and the third pixel electrode, wherein:
    forming the thin-film transistor includes forming a semiconductor layer, a gate electrode, and source and drain electrodes, and forming the first reflective layer, the second reflective layer, and the third reflective layer is simultaneously performed with one of forming the gate electrode or forming the source and drain electrodes.

17. The method as claimed in claim 11, further comprising:
    forming a common layer on the first pixel electrode, the second pixel electrode, and the third pixel electrode; and
    forming a red emission layer, a green emission layer, and a blue emission layer on the common layer,
    wherein the red emission layer, the green emission layer, and the blue emission layer correspond to the first pixel electrode, the second pixel electrode, and the third pixel electrode, respectively.

* * * * *